United States Patent [19]

Kodama et al.

[11] Patent Number: 5,045,487
[45] Date of Patent: Sep. 3, 1991

[54] PROCESS FOR PRODUCING A THIN FILM FIELD-EFFECT TRANSISTOR

[75] Inventors: Toshirou Kodama, Yokohama; Satoru Kawai, Kawasaki; Yasuhiro Nasu, Kawasaki; Nobuyoshi Takagi, Kawasaki; Shintaro Yanagisawa, Atsugi, all of Japan

[73] Assignee: Fujitsu Limited, Kawasaki, Japan

[21] Appl. No.: 408,944

[22] Filed: Sep. 18, 1989

Related U.S. Application Data

[60] Continuation of Ser. No. 302,996, Jan. 27, 1989, abandoned, which is a continuation of Ser. No. 198,581, May 2, 1988, abandoned, which is a continuation of Ser. No. 883,022, Jul. 9, 1986, abandoned, which is a division of Ser. No. 824,319, Jan. 31, 1986, abandoned, which is a continuation of Ser. No. 480,579, Mar. 30, 1983, abandoned.

[30] Foreign Application Priority Data

Mar. 31, 1982 [JP] Japan ................................. 57-53239

[51] Int. Cl.⁵ ........................................... H01L 21/312
[52] U.S. Cl. ..................................... 437/41; 437/101; 437/229; 357/23.7; 357/2; 357/4
[58] Field of Search .................... 357/2, 23.7, 23.9, 4; 437/40, 41, 181, 187, 229, 238, 101, 966; 350/336; 148/DIG. 1

[56] References Cited

U.S. PATENT DOCUMENTS

| | | | |
|---|---|---|---|
| 3,258,663 | 6/1966 | Weimer | 357/23.7 |
| 3,290,569 | 12/1966 | Weimer | 357/23.7 |
| 3,481,031 | 4/1967 | Klasens | 357/23.7 |
| 3,872,359 | 3/1975 | Feuersanger | 357/23.7 |
| 4,065,781 | 12/1977 | Gutknecht | 357/23.7 |
| 4,128,439 | 12/1978 | Jambotkar | 357/23.9 |
| 4,182,023 | 1/1980 | Cohen | 357/23.9 |
| 4,242,156 | 12/1980 | Peel | 437/84 |
| 4,332,075 | 6/1982 | Ota et al. | 437/51 |
| 4,398,340 | 8/1982 | Brown | 437/83 |
| 4,403,239 | 9/1983 | Yamazaki | 357/2 |
| 4,404,578 | 9/1983 | Takafuji et al. | 357/23.7 |
| 4,443,811 | 4/1984 | Tubbs | 357/23.9 |
| 4,459,739 | 7/1984 | Shepherd et al. | 437/25 |

FOREIGN PATENT DOCUMENTS 071244A 2/1983 European Pat. Off.
0113666 6/1984 Japan.

OTHER PUBLICATIONS

Staebler et al., "Conductivity Changes in Dehydrogenated and Rehydrogenated Discharge-Produced A--Si:H", Appl. Phys. Lett., 37(7) Oct. 1980, pp. 609-612.
Snell et al., "Application of Amorphous Silicon Field Effect Transistor in Addressable Liquid Crystal Display Panels", Appl. Physics 24 (1981) pp. 357-362.
Fang, "TFT Structure with Electronically Adjustable Threshold", IBM Technical Disclosure Bulletin, vol. 20, No. 12, May 1978, pp. 5352.
Hayama et al., "Amorphous-Silicon Thin-Film Metal-Oxide-Semiconductor Transistors" Appl. Phys. Letts. 36(9), May 1, 1980 pp. 454-455.
Weimer, "The TFT-A New Thin-Film Transistor", Proceedings of the IEEE, Jun. 1962, pp. 1462-1469.
SID 82 Digest, "Large-Scale LCDs Addressed by a-Si TFT Array", Okubo et al., pp. 40-43.
Hayama, Appl. Phys. Lett. 36(9), May 1, 1980.
Weimer Proceedings of the IEEE, Jun. 1962 p. 1462 et seq.

Primary Examiner—Olik Chaudhuri
Assistant Examiner—M. Wilczewski
Attorney, Agent, or Firm—Staas & Halsey

[57] ABSTRACT

A thin film transistor including a glass substrate and a gate electrode which is formed on the glass substrate. Source and drain electrodes are also provided. An insulating film covers at least the gate electrode and an amorphous semiconductor layer is formed on the insulating film. The semicondcutor layer includes a first portion having the source electrode formed thereon, a second portion having the drain electrode formed thereon, and a third portion formed between the first and second portions and located above the gate electrode, having a thin thickness which allows photolithographic light to permeate therethrough.

10 Claims, 10 Drawing Sheets

PROCESS FOR PRODUCING A THIN FILM FIELD-EFFECT TRANSISTOR

This is a continuation of copending application Ser. No. 07/302,996 filed on Jan. 27, 1989, now abandoned, which is a continuation of Ser. No. 07/198,581, filed on May 2, 1988, abandoned; which is a continuation of Ser. No. 06/883,022, filed 7/9/86, abandoned; which is a division of Ser. No. 06/824,319, filed 1/31/86, abandoned; and which is a continuation of Ser. No. 06/480,579, filed 3/30/83, abandoned.

BACKGROUND OF THE INVENTION

The present invention relates to a thin film field-effect transistor having an amorphous semiconductor and to a process for producing the same. A thin film field-effect transistor is hereinafter simply referred to as a thin film transistor.

A thin film transistor comprises a substrate which is made of an appropriate material, such as glass. A gate insulating film, an amorphous semiconductor layer such as an amorphous silicon layer, and source and drain electrodes are deposited on the substrate. The thin film transistor has attracted attention as a driving element for large-sized liquid crystal display devices in which liquid crystals are arranged in a matrix form.

The prior art is explained with reference to FIGS. 1 and 2.

Figure 1:
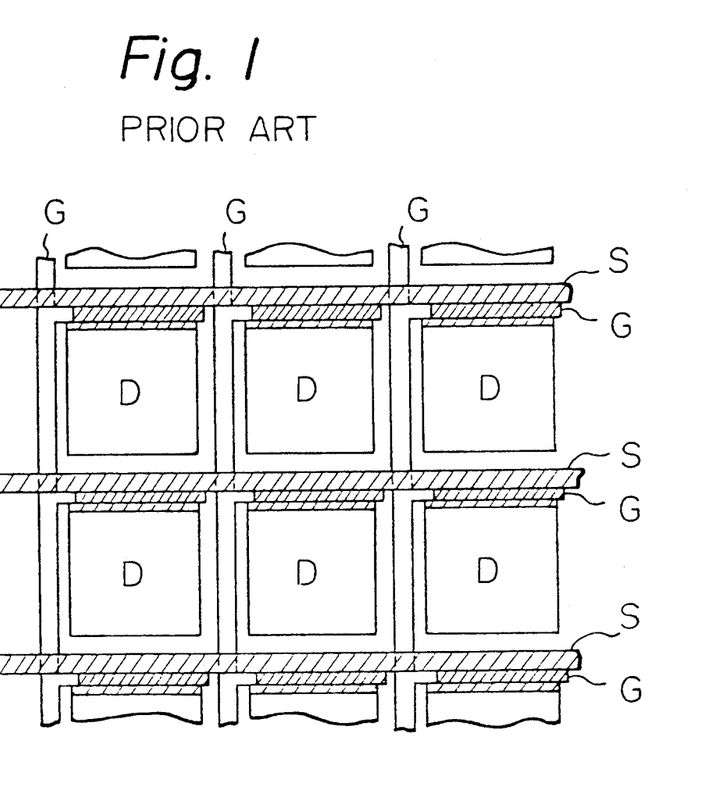
FIG. 1 is a schematic plan view of a prior art liquid-crystal display device.

In FIG. 1, the source electrodes S and the gate films G delineate the lateral and vertical lines of the matrix. The drain electrodes D are rectangular and have a large cross section. An opposite electrode ITO (FIG. 2) is arranged at the side of a liquid-crystal panel opposite to the drain electrodes D. As is shown in FIG. 2, the drain electrode D and the opposite electrode ITO form a pair of electrodes of the liquid-crystal panel. Glass plates GS are disposed at the outermost side of the liquid-crystal panel, and a liquid crystal L is sealed between the drain electrode D and the opposite electrode ITO. The distance between the drain electrode D and the opposite electrode ITO is approximately 10 $\mu$m.

Figure 2:
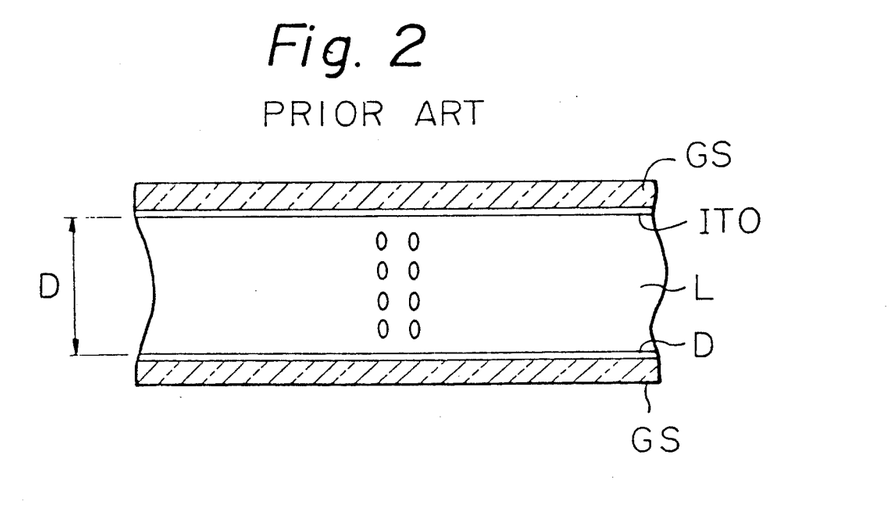
FIG. 2 is a cross-sectional view of FIG. 1.

The operation of the liquid-crystal display device shown in FIGS. 1 and 2 is now explained. When a voltage is applied to a predetermined source electrode S and to a predetermined gate electrode G, the predetermined source electrode S, gate electrode G, and drain electrode D, which form a thin film transistor, are energized, with the result that a part of the liquid crystal L becomes transparent because it is rearranged between the opposite electrode ITO and the predetermined drain electrode D. In order to obtain a fine image, a number of image-forming elements is necessary. In addition, in order to obtain a picture plane of a certain dimension, for example, size A-4, a number of driving units is necessary. Thin film transistors are appropriate driving units for obtaining an A-4 size picture plane having a fine image. However, integrated circuit chips a few millimeters in size are inappropriate driving units.

A known thin film transistor is explained with reference to FIG. 3, in which reference numeral 1 denotes a glass substrate, 2 a gate electrode made of metal, such as NiCr, 3 a gate insulating film made of $SiO_2$ or the like, 4 an amorphous silicon layer, 5 a source electrode, and 6 a drain electrode. The source electrode 5 and the drain electrode 6 are electrically conductive through a channel (not shown) which is formed in the amorphous silicon layer 4 when a voltage is applied to the gate electrode 2. The channel is formed above the gate electrode 2.

The known thin film transistor is produced by a procedure in which metal is deposited on the glass substrate 1 and is then delineated in the form of a gate electrode 2. Next, $SiO_2$ is grown by means of chemical vapor deposition (CVD) and is then delineated in the form of a gate insulating film 3. Subsequently, amorphous silicon is deposited on the entire top surface of the glass substrate 1 and is then delineated in the form of an amorphous silicon layer 4. Finally, the material of the source electrode 5 and the drain electrode 6 is deposited on the entire top surface of the glass substrate 1.

In the procedure described above, it is difficult to precisely align the gate, source, and drain electrodes. If the ends of the source electrode 5 and the drain electrode 6 are positioned outside the ends of the gate electrode 2, the source electrode 5 and the drain electrode 6 cannot be electrically connected to each other. Therefore, the thin film transistor is kept turned off even when a voltage is applied to the gate electrode 2. If the end of the source electrode 5 or the drain electrode 6 is positioned centrally, that is, if one of these electrodes overlaps the gate electrode 2, the coupling capacitance between the gate electrode 2 and the source electrode 5 or drain electrode 6 is increased so that the responding speed of the thin film transistor becomes slow.

SUMMARY OF THE INVENTION

It is an object of the present invention to provide a thin film transistor in which the source and drain electrodes are self-aligned with the gate electrode.

It is another object of the present invention to provide a process for producing a thin film transistor, in which the source and drain electrodes are self-aligned with the gate electrode.

In accordance with the objects of the present invention, there is provided a thin film transistor comprising:
a glass substrate;
a glass electrode which is formed on the glass substrate;
a source electrode;
a drain electrode;
an insulating film which covers at least the gate electrode; and
an amorphous semiconductor layer which is formed on the insulating film and which comprises a first portion having the source electrode thereon, a second portion having the drain electrode thereon, and a third portion formed between the first and second portions and located above the gate electrode and which is thin to allow the permeation of photolithographic light therethrough.

In accordance with the objects of the present invention, there is provided a process comprising the steps of:
forming a gate electrode on a glass substrate;
forming an insulating film which covers at least the gate electrode;
forming an amorphous semiconductor layer having a thin thickness which allows the permeation of photolithographic light therethrough;
forming a photoresist film on the amorphous semiconductor layer;
selectively exposing the photoresist film so that it is only above the gate electrode;
depositing the source and drain electrode material on the selectively exposed photoresist film and on portions of the amorphous semiconductor layer not covered by the selectively exposed photoresist film; and selectively removing the material which is deposited on the selectively exposed photoresist film, thereby forming the source and drain electrodes, separated from each other by a gap therebetween.

DESCRIPTION OF THE PREFERRED EMBODIMENTS

The thin film transistor according to the present invention was completed after extensive investigations. During the investigations, the present inventors produced the thin film transistor shown in FIG. 4, in which the same elements as those of the known thin film transistor (FIG. 3) are denoted by the same numbers. In the thin film transistor shown in FIG. 4, a source electrode 5 and a drain electrode 6, respectively, are self-aligned with a gate electrode 2. Such self-alignment is achieved by first forming the gate electrode 2 and then forming a gate insulating film 3 on the entire top surface of a glass substrate 1. Next, a photoresist film (not shown) is formed on the gate insulating film 3. The photoresist film is exposed to light which is applied from the bottom surface of the glass substrate 1 and is selectively left above the gate insulating film 3. The source electrode 5 and the drain electrode 6 are then formed by means of a lift-off method, in which the source and drain electrode material deposited on the photoresist film is selectively removed. This method is hereinafter referred to as a lift-off process in which a photoresist film is used.

Figure 4:
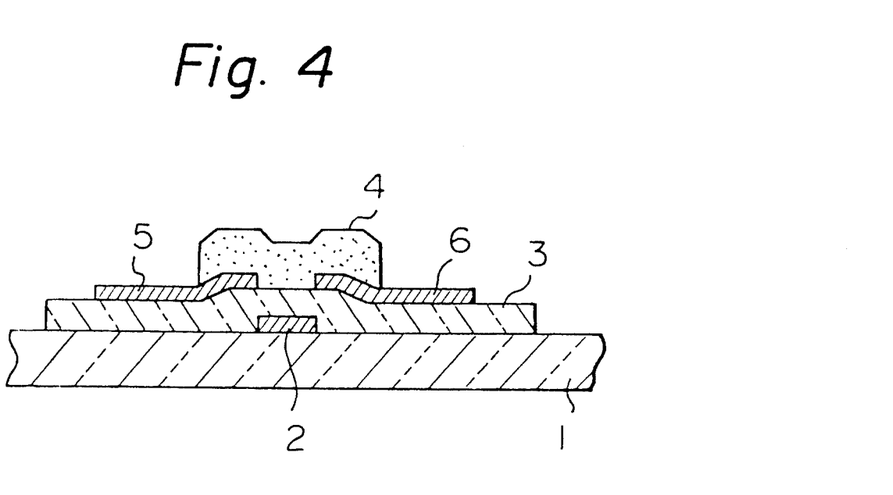
FIG. 4 is a schematic diagram of a thin film transistor developed by the present inventors.

After formation of the source electrode 5 and the drain electrode 6, an amorphous silicon layer 4 is formed. The drain current-gate voltage ($I_D$-$V_G$) characteristic of the thin film transistor, hereinafter referred to as the $I_D$-$V_G$ characteristic, is not excellent. However, the $I_D$-$V_G$ characteristic is improved, in accordance with the present invention, by the provision of an amorphous semiconductor layer which is formed on the insulating film, and which comprises a first portion having the source electrode formed thereon, a second portion having the drain electrode formed thereon, and a third portion which is formed between the first and second portions.

The preferred embodiments of the present invention are hereinafter described with reference to FIGS. 5 through 13.

Figure 5:
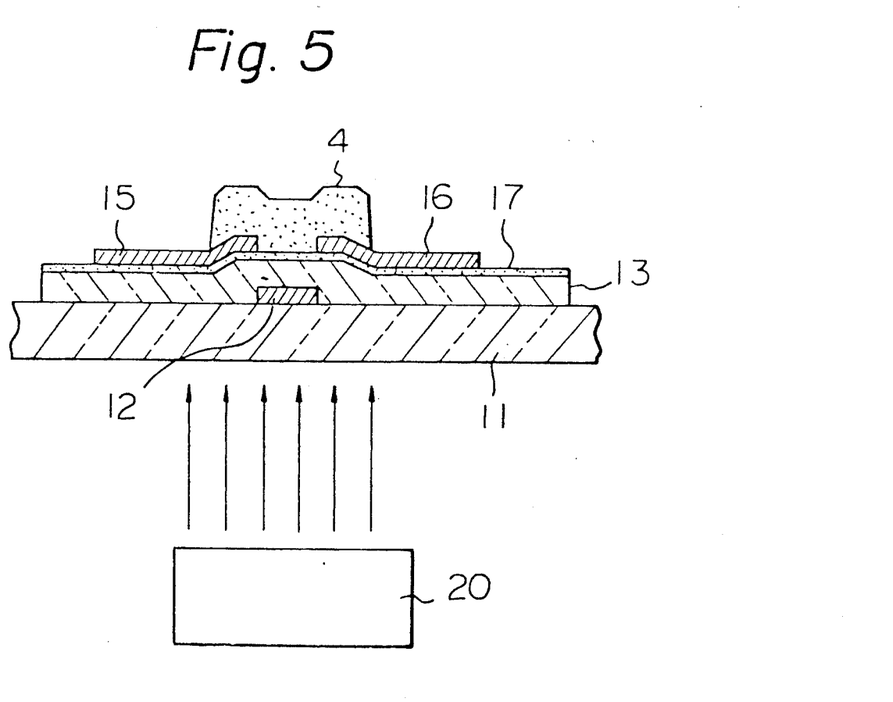
FIG. 5 is a schematic diagram of an embodiment of the thin film transistor according to the present invention.

In FIG. 5, a gate electrode 12 is formed on a glass substrate 11, and an insulating film 13 comprising $SiO_2$ covers the gate electrode 12 and the glass substrate 11. A portion of the insulating film 13 is used as the gate insulating film. An amorphous semiconductor layer 17 comprising silicon, is formed on the insulating film 13. The thickness of the amorphous semiconductor layer 17 is very thin so that the photoresist film (not shown) which is formed on the amorphous semiconductor layer 17 can be exposed to ultraviolet rays which are emitted from the lower surface of the glass substrate 11. The gate electrode 12 is used as a photolithographic mask so as to selectively remove the photoresist film. Since amorphous silicon has a high light absorption coefficient, e.g., a high ultraviolet ray absorption coefficient, if the amorphous semiconductor layer 17 is very thick, for example, if it exceeds 1,000 Å, it is difficult to carry out photolithography by means of light radiated from a light source 20 located behind the glass substrate 11. The thickness of the amorphous semiconductor layer 17 is determined based on the wavelength of the light source 20, which is usually a mercury lamp. In this case, the thickness of the amorphous semiconductor layer 17 should be from 50 Å to 1,000 Å. Reference numerals 15 and 16 denote a source electrode and a drain electrode, respectively.

A process for producing a thin film transistor, such as the one shown in FIG. 5, is described with reference to FIGS. 6A through 6E.

A gate electrode 12 (FIG. 6A) is formed on a glass substrate 11. The gate electrode 12 may comprise NiCr alloy and may have a thickness of approximately 1,000 Å. A conductive film 90, which has a large dimension and is transparent, is formed on the glass substrate 11.

An insulating film 13 (FIG. 6B) has a thickness of approximately 3000 Å and consists of $SiO_2$. An amorphous semiconductor layer 17 is formed on the insulating film 13 and has a thickness from 50 Å to 1,000 Å. The insulating film 13 and the amorphous semiconductor layer 17 are consecutively formed. That is, a mixture of silane ($SiH_4$) gas and nitrous oxide ($N_2O$) gas is used as a source of plasma, and plasma CVD is carried out under a predetermined degree of vacuum. Thereby, the insulating film 13 is formed. Then, while maintaining the predetermined degree of vacuum, the mixture is replaced with silane ($SiH_4$) gas, and plasma CVD is again carried out. Thereby, the amorphous semiconductor layer 17 is formed.

Figure 6A:
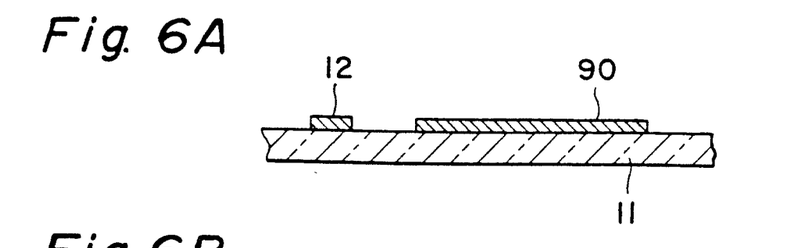
FIGS. 6A through 6E illustrate an embodiment of the process according to the present invention.
Figure 6B:
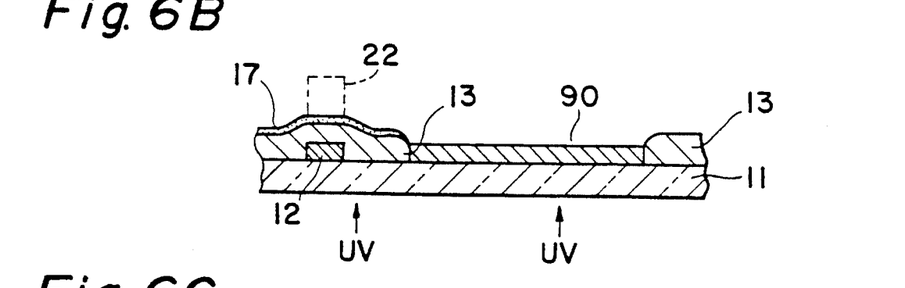

A positive photoresist film 22 is applied over the entire top surface of the device, and ultraviolet rays UV are then radiated from the lower surface of the glass substrate 11 so as to selectively expose the photoresist film 22. Only a portion of the photoresist film 22 above the gate electrode 12 is not exposed, and therefore this portion is not removed during developing. The photoresist film 22 is therefore left only above the gate electrode 12.

Figures 6C, 6D:
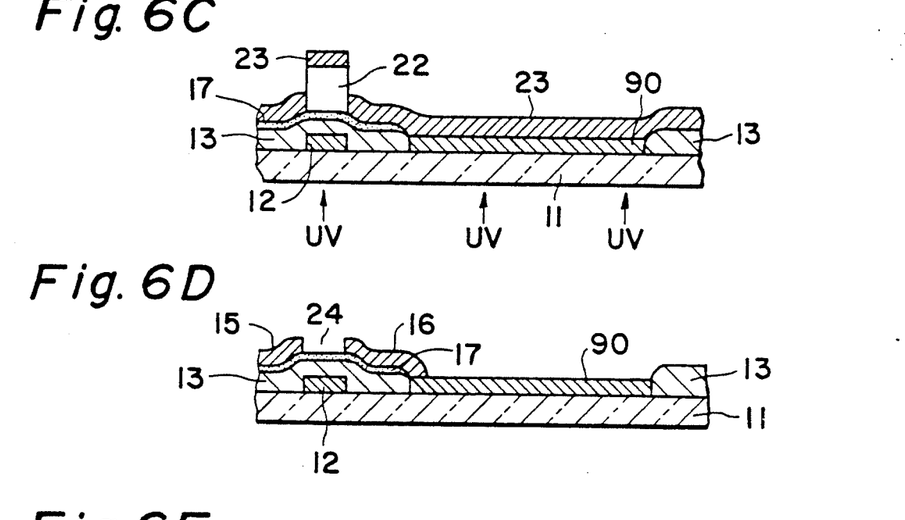
Figure 6E:
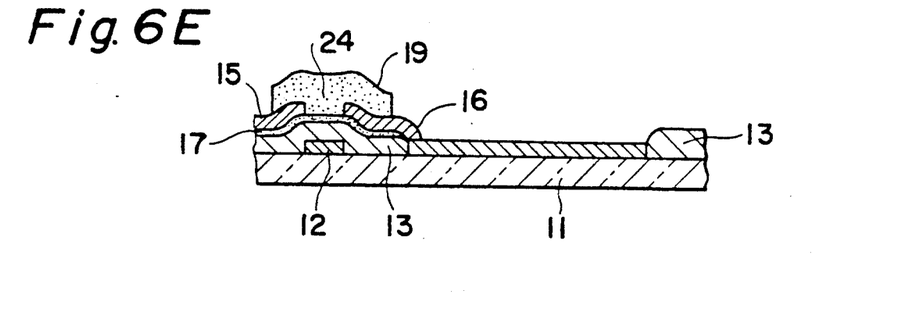

Aluminum 23 (FIG. 6C) is deposited over the entire top surface of the device. The deposition of aluminum is carried out by means of vacuum evaporation so as to obtain a thickness of approximately 2,000 Å. When the photoresist film 22 is removed with a solvent, the aluminum 23 deposited on the photoresist film 22 is selectively removed (by means of the lift-off method), so as to leave a source electrode 15 and a drain electrode 16 which are separated by a gap 24 (FIG. 6D). The drain electrode 16 is connected to the transparent conductive film 90. The ends of the source electrode 15 and the drain electrode 16 are precisely aligned with the ends of the gate electrode 12. The remaining portion of the aluminum layer 23 on top of the transparent conductive film 90 is then removed.

An amorphous silicon layer 19 (FIG. 6E) is deposited on the entire top surface of the device so that the thickness of the layer 19 is 5,000 Å or less. The amorphous semiconductor layer 19 is then delineated so that it is left at least in the gap 24 and on the source electrode 15 and drain electrode 16.

Referring again to FIG. 3, since the source electrode 5 and the drain electrode 6 are formed on the amorphous silicon layer 4, the current passes across the amorphous silicon layer 4 through the channel formed between the bottom and top parts of the layer 4. Therefore, a resistor corresponding to the thickness of the amorphous silicon layer 4 is connected in series between the source electrode 5 and the drain electrode 6, with the result that the ON current of a thin film transistor is very low.

Figure 3:
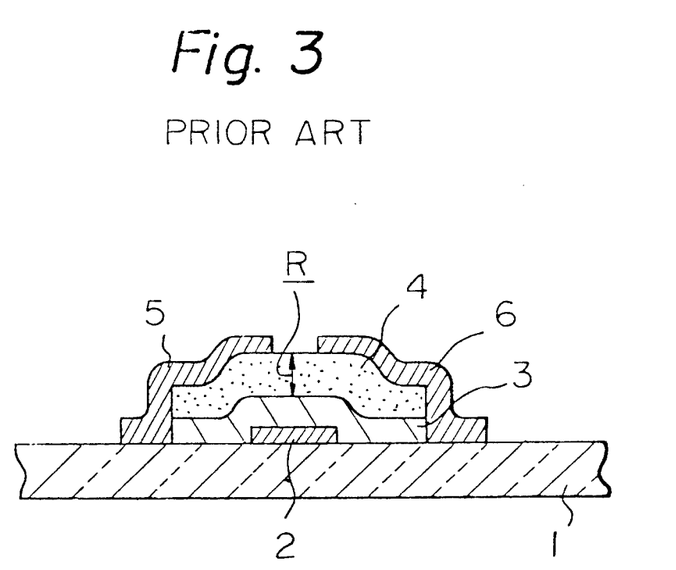
FIG. 3 is a schematic diagram of a prior art thin film transistor.

Referring again to FIG. 6E, the resistor in FIG. 3 is small because of the thin thickness of the amorphous semiconductor layer 17 and is connected between the source electrode 15 and the drain electrode 16 since a channel (not shown) is formed at the interface between the insulating film 13 and the amorphous semiconductor layer 17. This interface is free of contamination and thermal strain because the insulating film 13 and the amorphous semiconductor layer 17 are consecutively formed in the same plasma CVD vessel.

Figure 7:
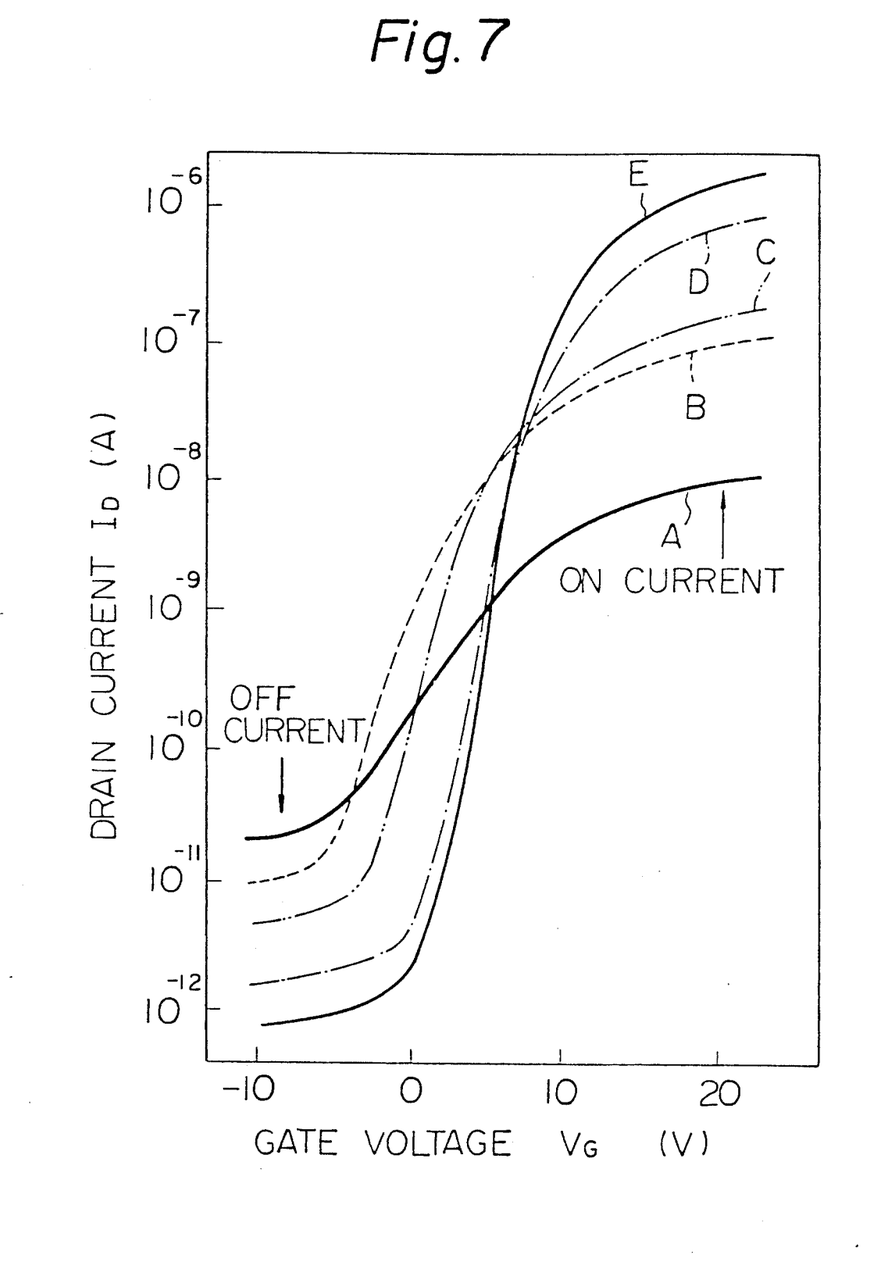
FIG. 7 is a graph of the $I_D$-$V_G$ characteristic of FIGS. 4 and 6E.

Referring to FIG. 7, the $I_D$-$I_G$ characteristic of the following thin film transistors is illustrated:

A—the thin film transistor shown in FIG. 4;
B—the thin film transistor shown in FIG. 6E having a 30 Å-thick amorphous semiconductor layer 17;
C—the thin film transistor shown in FIG. 6E having a 50 Å-thick amorphous semiconductor layer 17;
D—the thin film transistor shown in FIG. 6E having a 100 Å-thick amorphous layer 17; and
E—the thin film transistor shown in FIG. 6E having a 150 Å-thick amorphous semiconductor layer 17.

In the film transistors A through E, the gate electrodes 2 (FIG. 4) and 12 (FIG. 6E) are 1000 Å thick, the insulating films 3 (FIG. 4) and 13 (FIG. 6E) are 3,000 Å thick, and the amorphous semiconductor layers 4 (FIG. 4) and 19 are 3,000 Å thick.

As is apparent from FIG. 7, the thin film transistors C, D, and E exhibit an excellent $I_D$-$V_G$ characteristic while the thin film transistor B has a low ON current and a high OFF current, which is disadvantageous. The process for producing a liquid-crystal display device is illustrated with reference to FIGS. 8A, 8B and 8C.

Figure 8A:
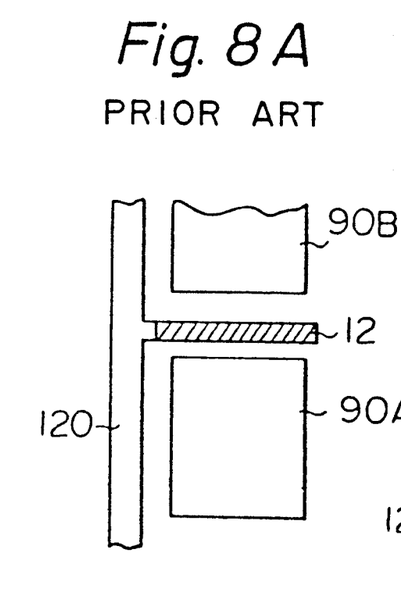
FIGS. 8A through 8C illustrate a process for manufacturing a liquid-crystal display device.
Figure 8B:
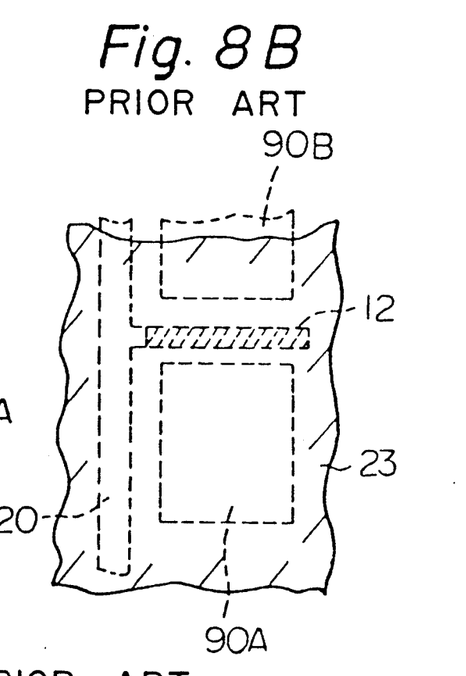

In FIG. 8A, the gate electrode 12 is connected to a gate bus 120, and a plurality of transparent conductive films 90A and 90B are formed. FIG. 8A corresponds to FIG. 6A, in which the gate electrode 12 and the transparent conductive film 90 are formed on a glass substrate 22. Aluminum 23 (FIG. 8B) is deposited so that it covers the gate bus 120, the gate electrode 12, and the transparent conductive films 90A and 90B. FIG. 9B corresponds to a plan view of FIG. 6C.

Figure 8C:
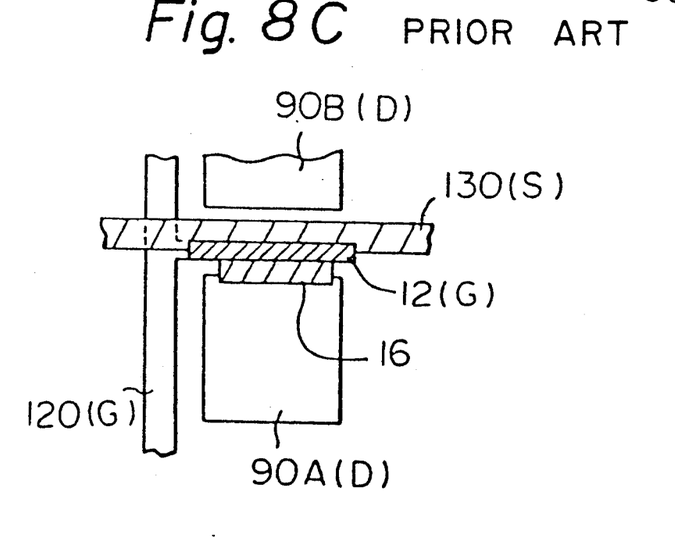

In FIG. 8C, a source bus 130 and a drain electrode 16 are formed, and the symbols in parentheses correspond to the elements of the liquid-crystal display device shown in FIG. 1.

Figure 9A:
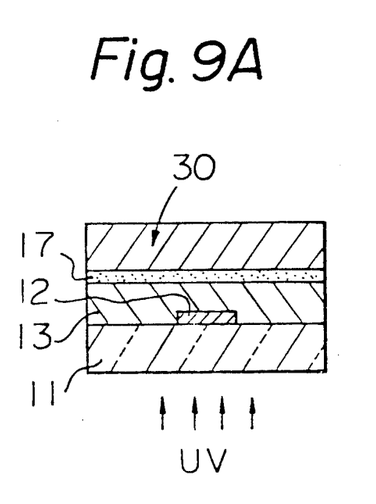
FIGS. 9A through 9D and FIGS. 10A through 10F illustrate another embodiment of the process according to the present invention.

According to a preferred embodiment of the process of the present invention, an amorphous semiconductor layer and a passivation film are consecutively formed on a glass substrate having a gate insulating film thereon and then the gate electrode is used as a mask so as to selectively remove the passivation film. Subsequently, the source and drain electrodes are formed by means of the lift-off method in which a photoresist film is used. This embodiment is hereinafter described with reference to FIGS. 9A through 9D, in which the same reference numerals as those in FIGS. 6A through 6E denote the same elements of a thin film transistor. In FIG. 9A, an amorphous semiconductor layer 17 and the passivation film 30 are consecutively formed. A gate electrode 12 is light-impermeable, and a glass substrate 11, an insulating film 13, an amorphous semiconductor layer 17, and a passivation film 30 are light-permeable. The gate electrode 12 has a thickness of 0.1 μm, the insulating film 13 has a thickness of 0.3 μm, the amorphous semiconductor layer 17 has a thickness of 50–1,000 Å, and the passivation film 30 has a thickness of 0.5 μm.

Figure 9B:
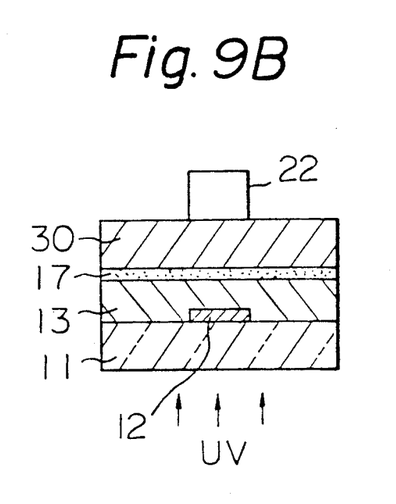

In FIG. 9B, a photoresist film 22, which may be a positive-type AZ1350J film (e.g., sold by Shipley Company, Inc.), is deposited and is then exposed to ultraviolet (UV) rays. Subsequently, the photoresist film 22 is developed for the standard 30 seconds.

Figure 9C:
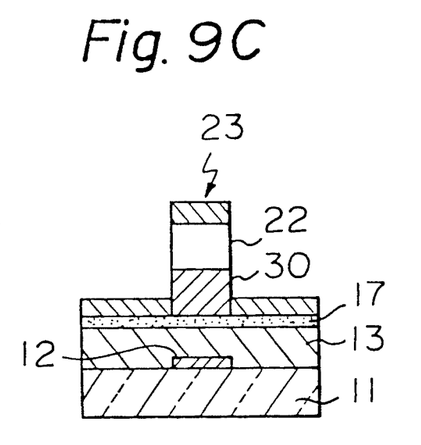

In FIG. 9C, the photoresist film 22 is used as a mask to selectively remove the exposed portion of the passivation film 30. This can be carried out by using an etchant selected from the group consisting of HF, $NH_3$ and $H_2O$. However, the amorphous semiconductor layer 17 is not etched with this etchant.

Figure 9D:
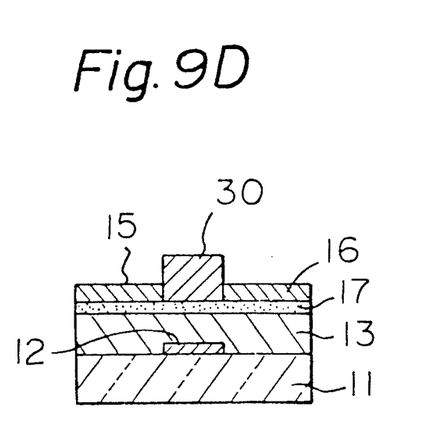

Aluminum 23 is deposited to a thickness of 0.2 μm, and, subsequently, the aluminum 23 is selectively removed by means of the lift-off method in which a photoresist film is used, so as to form a source electrode 15 and a drain electrode 16 (FIG. 9D).

According to a preferred embodiment of the present invention, portions of the amorphous semiconductor layer, on which portions the source and drain electrodes are formed, are doped with an N-type impurity. According to another preferred embodiment of the present invention, an amorphous semiconductor layer containing a doped N-type impurity is formed at a temperature of from 100° C. to 150° C. These two preferred embodiments are hereinafter described with reference to FIGS. 10A through 10F, in which the same reference numerals as those in FIGS. 6A through 6E denote the same elements of a thin film transistor.

Figure 10A:
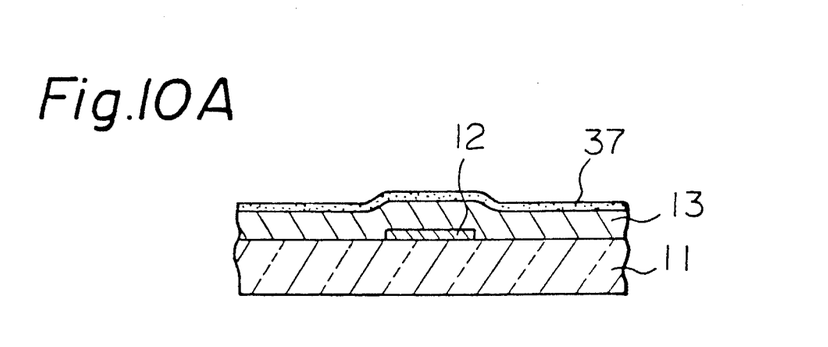

In FIG. 10A, an insulating film 13 and a non-doped hydrogenated amorphous silicon layer (hereinafter referred to as a non-doped a-SiH layer) 37 are consecutively formed by means of plasma CVD process and a predetermined degree of vacuum (e.g., 0.1 Torr) is preferably maintained during such plasma CVD process. The non-doped a-SiH layer 37 preferably has a thickness form 50 Å to 1,000 Å.

Figure 10B:
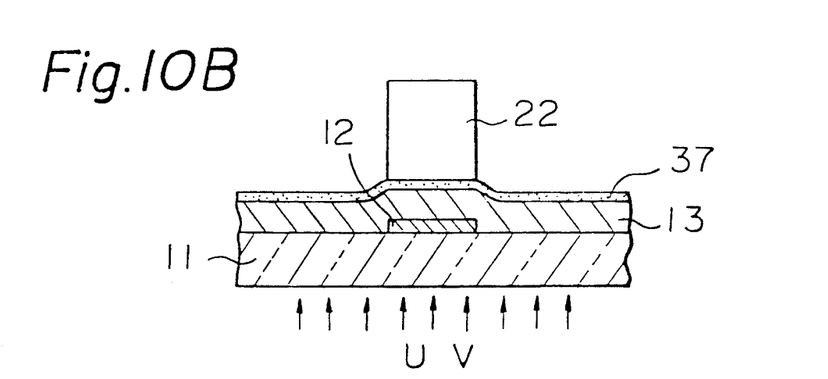

In FIG. 10B, the gate electrode is used to delineate the photoresist film 22.

Figure 10C:
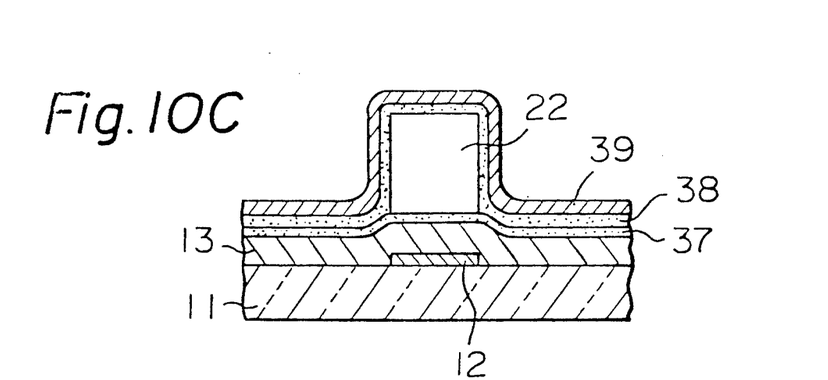

In FIG. 10C, a doped hydrogenated amorphous silicon layer (hereinafter referred to as a doped a-SiH layer) 38 is formed on the entire top surface of a glass substrate 11. The doped a-SiH layer 38 can be formed by means of a plasma CVD in which a $SiH_4$ gas containing from 200 ppm to 1% by weight of $PH_3$ is used. During a plasma CVD process, the $SiH_4$ gas and the glass substrate 11 are heated to a temperature of from 100° C. to 150° C. The doped a-SiH layer 38 preferably has a thickness from 200 Å to 500 Å. Subsequently, an electrode material 39, such as Al or NiCr, is deposited on the doped a-SiH layer 38. The electrode material 39 preferably has a thickness of 2,000 Å.

Figure 10D:
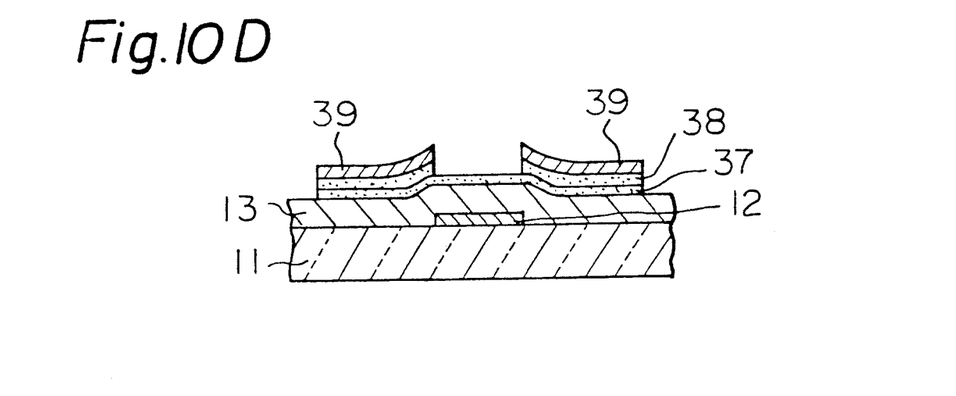

In FIG. 10D, the electrode material 39 and the doped a-SiH layer 38 are selectively removed by means of the lift-off method.

Figure 10E:
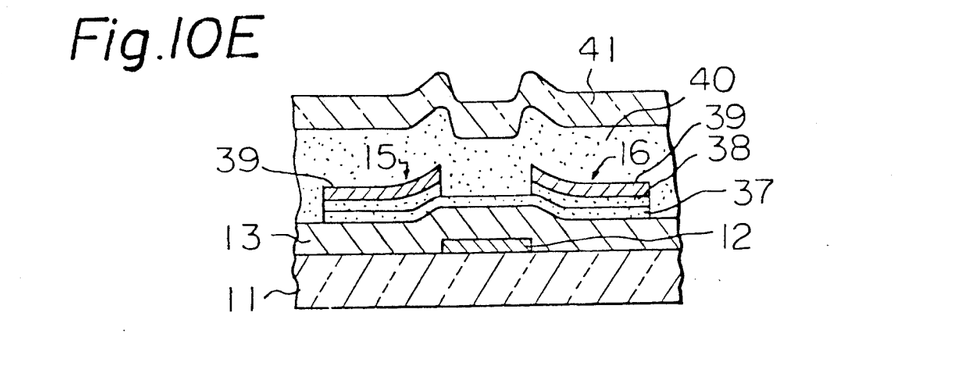

In FIG. 10E, a non-doped a-SiH layer 40 and a passivation film 41 are formed. It is preferred that the non-doped a-SiH layer 40 and the passivation film 41 be consecutively formed by means of a plasma CVD, during which a predetermined degree of vacuum is maintained. The passivation film 41 may comprise $SiO_2$ or $Si_3N_4$.

The non-doped a-SiH layer 40 and the passivation film 41 are delineated so that they cover at least the exposed portion of the non-doped a-SiH layer 37.

Figure 10F:
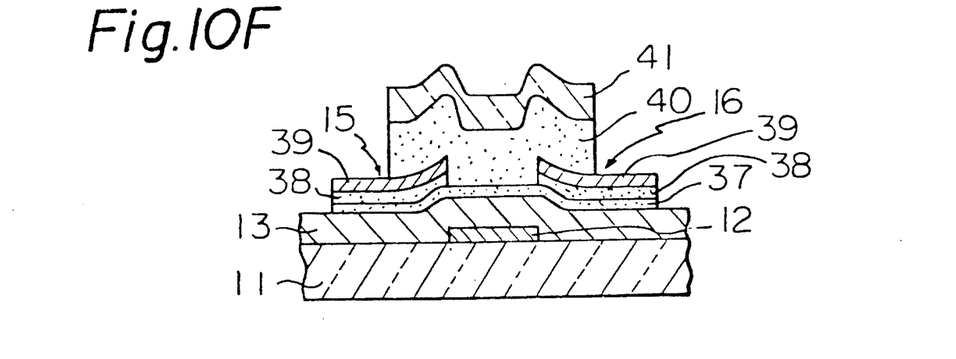

Since in the embodiments described with reference to FIGS. 10A through 10F the temperature of the glass substrate 11 does not exceed 150° C. during formation of the doped a-SiH layer 38, a photoresist film 22 is not damaged. As a result, the photoresist film 22 can be used for the lift-off process. In addition, since an impurity, having one type of conductivity, such as P, in the a-SiH layer 38 is activated at a temperature from 100° C. to 300° C., a carrier or impurity having an opposite type of conductivity is blocked by the doped a-SiH layer 38. Therefore, the $I_D$-$V_G$ characteristic of a thin film transistor such as the one shown in FIG. 10F, is excellent.

Figure 11:
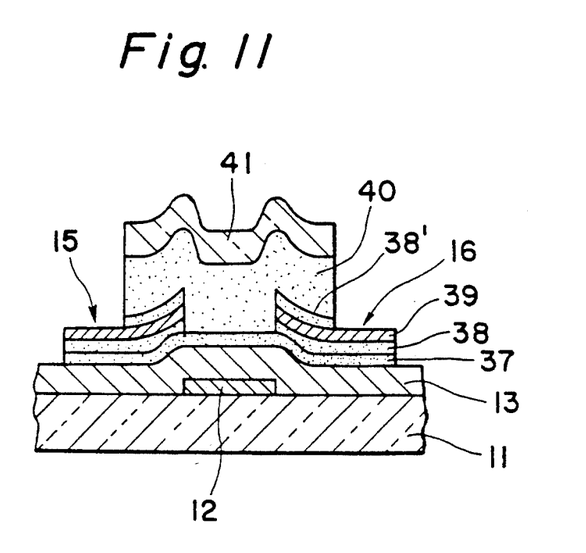
FIG. 11 is a schematic diagram of a thin film transistors according to other embodiment of the present invention.

In FIG. 11, another embodiment of the thin film transistor according to the present invention is illustrated. The source and drain electrodes 15 and 16 additionally comprise a doped a-SiH layer 38' at the top thereof. This thin film transistor can be fabricated by the same process set forth in FIGS. 10C-10F.

The thin film transistor according to the present invention is improved over conventional thin film transistors for the following reasons:

A. The coupling capacitance between the gate electrode and the drain electrode is very low and thus the response characteristic is excellent.
B. There are no decrease in the ON current due to the resistor connected in series with the non-doped amorphous semiconductor layer.
C. Uniformity of thin film transistor characteristics is excellent over a large area of the substrate.
D. It is easy to fabricate a thin film transistor having a short gate length.
E. Fabrication processes are simplified because mask alignment during the fabrication of source and drain electrodes is not necessary.

We claim:

1. A process for producing a thin film transistor having a glass substrate, comprising the steps of:
    (a) forming a gate electrode on the glass substrate;
    (b) forming an insulating film on at least the gate electrode;
    (c) forming an amorphous semiconductor layer having a thickness which allows photolithographic light to permeate therethrough;
    (d) forming a positive photoresist film on the amorphous semiconductor layer;
    (e) selectively exposing the photoresist film from underneath the glass substrate so that it remains only above the gate electrode;
    (f) depositing source and drain electrode material on the remaining photoresist film and on portions of the amorphous semiconductor layer not covered by the remaining photoresist film; and
    (g) selectively removing the electrode material which is deposited on the remaining photoresist film, thereby forming source and drain electrodes separated from each other by a gap formed therebetween.

2. A process according to claim 1, wherein said steps (b) and (c) comprise consecutively forming the insulating film and the amorphous semiconductor layer by means of a plasma CVD process.

3. A process according to claim 1, wherein the plasma CVD process includes the step of maintaining a predetermined degree of vacuum.

4. A process for producing a thin film transistor having a glass substrate, comprising the steps of:
    (a) forming a gate electrode on the glass substrate;
    (b) forming an insulating film which covers at least the gate electrode;
    (c) forming an amorphous semiconductor layer on the insulating layer, having a thickness which allows photolithographic light to permeate therethrough;
    (d) forming a passivation film on the amorphous semiconductor layer, the amorphous semiconductor layer and the passivation film being consecutively formed;
    (e) forming a positive photoresist on the passivation film;
    (f) selectively exposing the photoresist film from underneath the glass substrate so that it remains only above the gate electrode;
    (g) selectively removing the passivation film by using the remaining photoresist film as a mask;
    (h) depositing source and drain electrode material on the remaining photoresist film and on portions of the passivation film; and
    (i) selectively removing the electrode material deposited on the remaining photoresist film, thereby forming source and drain electrodes.

5. A process for producing a thin film transistor according to claim 4, wherein said step (c) comprises forming the amorphous semiconductor layer to a thickness of from 50 Å to 1000 Å.

6. A process or producing a thin film transistor having a glass substrate, comprising the steps of:
    (a) forming a gate electrode on the glass substrate;
    (b) forming an insulating film which covers at least the gate electrode;
    (c) forming an amorphous semiconductor layer on the insulating film, having a thickness which allows photolithographic light to permeate therethrough;
    (d) forming a positive photoresist film on the amorphous semiconductor layer;
    (e) selectively exposing the photoresist film from underneath the glass substrate so that it remains only above the gate electrode;
    (f) forming a doped amorphous semiconductor layer, at a temperature of from 100° C. to 150° C., on the remaining photoresist film and portions of the amorphous semiconductor layer;
    (g) depositing source and drain electrode material on the doped amorphous semiconductor layer;
    (h) selectively removing the source and drain electrode material deposited on the remaining photoresist film, thereby forming source and drain electrodes which are separated from each other by a gap therebetween; and (i) activating an impurity contained in the doped amorphous semiconductor layer by applying a temperature of from 250° C. to 350° C.

7. A process for producing a thin film transistor according to claim 6, wherein said step (f) comprises forming the doped amorphous semiconductor layer having a N-type impurity.

8. A process for producing a thin film transistor according to claim 6, wherein said step (a) comprises forming the gate electrode to a thickness of approximately 0.1 μm.

9. A process for producing a thin film transistor according to claim 6, wherein said step (b) comprises forming the insulating film to a thickness of approximately 0.3 μm.

10. A process for producing a thin film transistor according to claim 6, wherein said step (c) comprises forming the amorphous semiconductor layer to a thickness of form 50 Å to 1000 Å.

* * * * *